United States Patent
van der Sanden et al.

(10) Patent No.: US 8,094,187 B2
(45) Date of Patent: Jan. 10, 2012

(54) METHOD OF PLACING A COMPONENT BY MEANS OF A PLACEMENT DEVICE AT A DESIRED POSITION ON A SUBSTRATE HOLDER, AND DEVICE SUITABLE FOR PERFORMING SUCH A METHOD

(75) Inventors: Henricus T. J. A. G. van der Sanden, Eindhoven (NL); Josephus M. M. van Gastel, Eindhoven (NL)

(73) Assignee: Assembleon N.V., Eindhoven (NL)

( * ) Notice: Subject to any disclaimer, the term of this patent is extended or adjusted under 35 U.S.C. 154(b) by 1328 days.

(21) Appl. No.: 10/515,125

(22) PCT Filed: May 20, 2003

(86) PCT No.: PCT/IB03/02139
§ 371 (c)(1),
(2), (4) Date: Jun. 10, 2005

(87) PCT Pub. No.: WO03/098990
PCT Pub. Date: Nov. 27, 2003

(65) Prior Publication Data
US 2005/0225631 A1    Oct. 13, 2005

(30) Foreign Application Priority Data
May 22, 2002    (EP) .................................. 02077002

(51) Int. Cl.
*H04N 7/18*    (2006.01)
(52) U.S. Cl. ............ 348/87; 348/125; 348/126; 348/129
(58) Field of Classification Search ........................ None
See application file for complete search history.

(56) References Cited

U.S. PATENT DOCUMENTS

| | | | | |
|---|---|---|---|---|
| 4,846,619 A | * | 7/1989 | Crabtree et al. | 414/273 |
| 5,172,468 A | * | 12/1992 | Tanaka et al. | 29/721 |
| 5,680,698 A | * | 10/1997 | Armington et al. | 29/833 |

(Continued)

FOREIGN PATENT DOCUMENTS

EP    764885 A2 *    3/1997

(Continued)

OTHER PUBLICATIONS

Baartman, "Placing surface mount components using coarse/fine positioning and vision," *IEEE Transactions on Components Hybrids and Manufacturing Technology*, Sep. 1990, pp. 559-564, vol. 13, No. 3.

*Primary Examiner* — Christopher S Kelley
*Assistant Examiner* — Christopher Findley
(74) *Attorney, Agent, or Firm* — Foley & Lardner LLP

(57) ABSTRACT

A method places a component at a desired position on a substrate by means of a placement device. The component is transported to an intermediate position above the desired position and a position difference between the intermediate position and the desired position is determined by means of a camera and a processor. Subsequently, the component is transported to the desired position on the substrate, making use of the position difference. The camera, which is arranged at the side of the component opposite the component's side facing the substrate, takes an image of at least the portion of the substrate that includes the desired position as well as the placement device.

13 Claims, 6 Drawing Sheets

U.S. PATENT DOCUMENTS

| | | | |
|---|---|---|---|
| 5,878,484 A * | 3/1999 | Araya et al. | 29/740 |
| 6,203,082 B1 * | 3/2001 | Bendat et al. | 294/185 |
| 6,359,646 B1 * | 3/2002 | Kanauchi | 348/87 |
| 6,404,912 B1 * | 6/2002 | Lehnen et al. | 382/151 |
| 6,538,425 B1 * | 3/2003 | Kawada | 324/158.1 |
| 2001/0025413 A1 * | 10/2001 | Asai et al. | 29/832 |
| 2001/0055069 A1 * | 12/2001 | Hudson | 348/302 |
| 2002/0071601 A1 * | 6/2002 | Kawada | 382/145 |
| 2002/0085189 A1 * | 7/2002 | Simpson et al. | 355/53 |
| 2003/0064307 A1 * | 4/2003 | Nakamura et al. | 430/22 |

FOREIGN PATENT DOCUMENTS

| | | |
|---|---|---|
| JP | 6257281 | 3/1987 |
| JP | 1070395 | 3/1989 |
| JP | 1276800 | 11/1989 |
| JP | 6257281 | 9/1994 |
| JP | 1070395 | 3/1998 |
| JP | 11285925 | 10/1999 |

* cited by examiner

METHOD OF PLACING A COMPONENT BY MEANS OF A PLACEMENT DEVICE AT A DESIRED POSITION ON A SUBSTRATE HOLDER, AND DEVICE SUITABLE FOR PERFORMING SUCH A METHOD

BACKGROUND

The invention relates to a method of placing a component at a desired position on a substrate by means of a placement device. The invention also relates to a device suitable for performing such a method.

In such a method and device, known from international patent application WO 97/02708, a component is taken up from a component supply device, while using a placement device. A substrate is brought to a predetermined position by means of a substrate holder. Together with the component, the placement device is displaced to the intermediate position above the desired position on the substrate. Subsequently, an alignment device provided with at least a camera, an optical system and illumination devices is positioned between the placement device and the substrate. The position of the component as well as the position of the location on the substrate on which the component must be placed is determined by means of the alignment device and the processor connected thereto. Subsequently, it is determined by means of the processor whether the component is exactly situated above the desired position on the substrate or whether there are deviations between the intermediate position and the desired position.

Subsequently, the alignment device is removed from the area between the placement device and the substrate, whereafter the placement device is displaced with reference to given deviations between the intermediate position and the desired position, such that the component is positioned at the desired position of the substrate.

Although accurate placement of the component on the substrate is guaranteed by means of such a method and device, it is a relatively time-consuming matter to provide the alignment device between the placement device and the substrate and remove it again. Moreover, the placement device should be situated at a relatively large distance above the substrate so as to provide sufficient space for positioning the alignment device between the placement device and the substrate. This relatively large distance may lead to errors during placement. Moreover, it takes a relatively long time to bridge this distance.

It is an object of the invention to provide a method with which the component can be positioned at a desired position on the substrate in a relatively accurate and rapid manner.

SUMMARY

According to an embodiment of the invention, this object is achieved using an image of at least a part of the substrate comprising the desired position and of the placement device supporting the component is made by means of the camera from a side of the component remote from the substrate.

An embodiment of the invention relates to a method of placing a component at a desired position on a substrate by means of a placement device, wherein the component is displaced by means of the placement device to an intermediate position above the desired position on the substrate, whereafter a difference between the intermediate position of the component and the desired position of the component on the substrate is determined by means of at least a camera and a processor, whereafter the component is displaced by means of the placement device on the basis of the difference between the intermediate position and the desired position with respect to the substrate and is positioned at the desired position on the substrate. The invention also relates to a device suitable for performing such a method.

By making an image from a side of the component remote from the substrate, the camera does not need to be accommodated in the space between the placement device and the substrate. Consequently, the placement device can be arranged closer to the substrate before the image is made. Since the placement device as well as the substrate are visible on the image, the relative mutual position between the placement device and the substrate can be directly determined.

In the method described in the aforementioned international patent application WO 97/02708, two images are made, or two images are imaged one on the other by means of an optical system. Although in latter case, the optical system should be relatively accurate so as to guarantee an accurate projection of the two superposed images, the method still requires two images. In contrast, according to an embodiment of the method according to the invention, an image of both the placement device and the substrate may be made directly.

When the image is made, the placement device may be situated at a relatively short distance above the substrate so that possible deviations between the intermediate position of the component and the desired position of the component on the substrate can be determined with reference to the image in a relatively accurate manner. Subsequently, the component can be placed on the substrate relatively rapidly, because the distance to be bridged between the intermediate position and the desired position is relatively small.

According to an embodiment of the method according to the invention, the relative position of the placement device with respect to the desired position of the component on the substrate may be determined from the image.

By determining the relative position of the placement device with respect to the desired position of the component on the substrate with reference to the image, the placement device can be displaced relatively rapidly and with relatively little accuracy to the part of the substrate comprising the desired position, whereafter the placement device can be accurately positioned after a relative position of the placement device with respect to the substrate has been determined.

According to a further embodiment of the method according to the invention, prior to displacing the placement device to the intermediate position situated above the desired position, the relative position of the component with respect to the placement device may be determined, whereafter the relative position of the placement device with respect to the substrate may be determined with reference to the image, and subsequently the relative position of the component with respect to the substrate may be determined with reference to the relative positions of the component with respect to the placement device and of the placement device with respect to the desired position on the substrate. This provides the possibility of accurately determining the mutual position of the component with respect to the substrate with reference to the relative positions of the placement device with respect to the component and the substrate.

According to another embodiment of the method according to the invention, the component may also be visible on the image of at least the part of the substrate. The relative position of the component with respect to the substrate may be directly determined with reference to the image. If the component is also visible on the image, it may be possible to directly determine the relative position of the component with respect to the substrate, so that it is no longer necessary to determine the relative position of the placement device with respect to the component or the substrate.

The invention also relates to a device provided with a substrate carrier, a placement device that is displaceable with respect to the substrate carrier, at least a camera, a processor and an optical system arranged between the camera and the placement device.

According to an embodiment of the device, at least a part of the placement device and at least a part of a substrate supported, in operation, by the substrate carrier may be imaged in the camera by means of the optical system. As both the placement device and the substrate can be simultaneously imaged in the camera, the relative position of the placement device with respect to the substrate or of the component, supported by the placement device, with respect to the substrate can be determined in a relatively simple manner.

According to another embodiment of the device, the placement device may also be provided with at least one mark. The mark may guarantee a satisfactory detectability of the placement device.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1A:
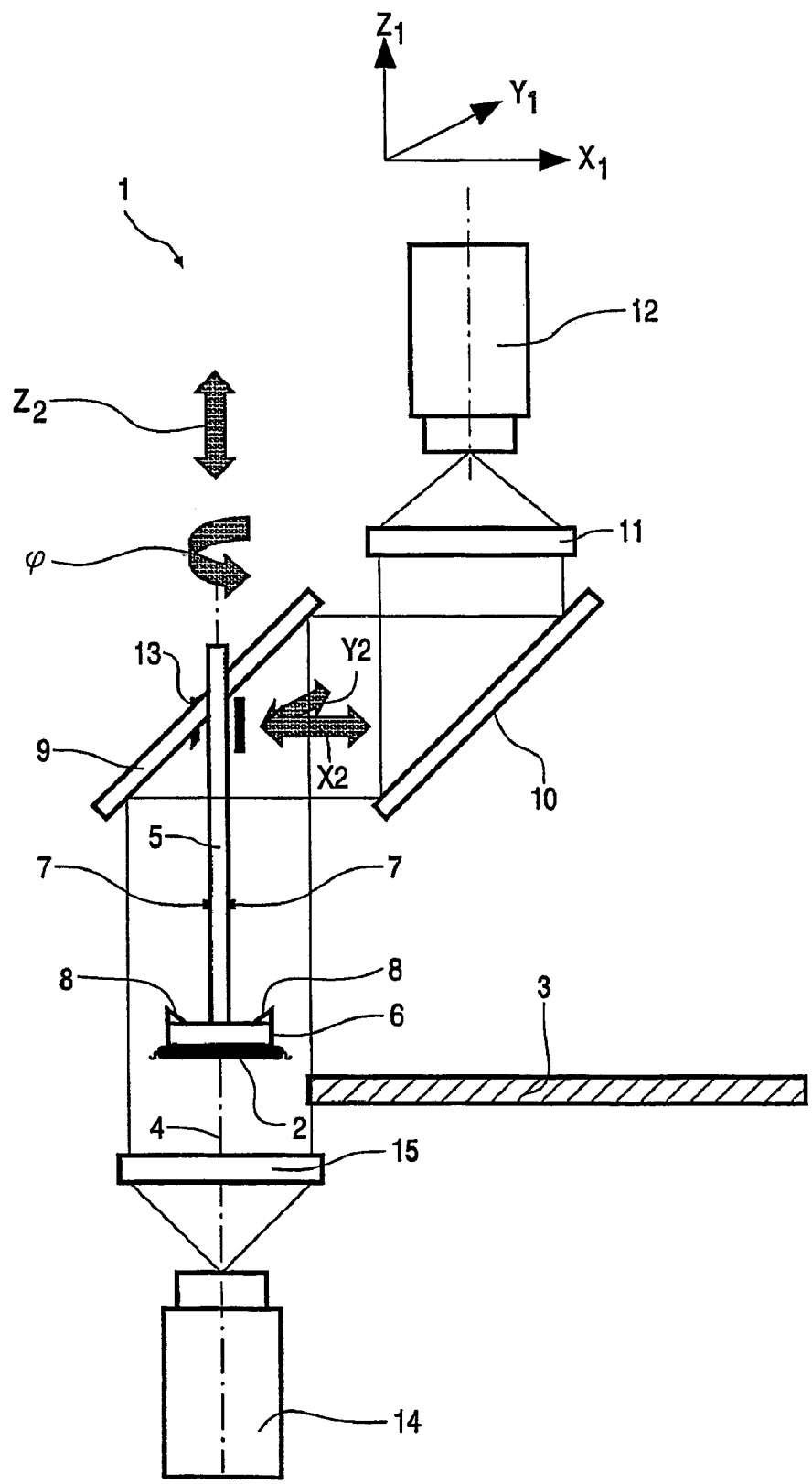
FIGS. 1A to 1C show a device according to the invention during different stages of placing a component on a substrate.
Figure 1B:
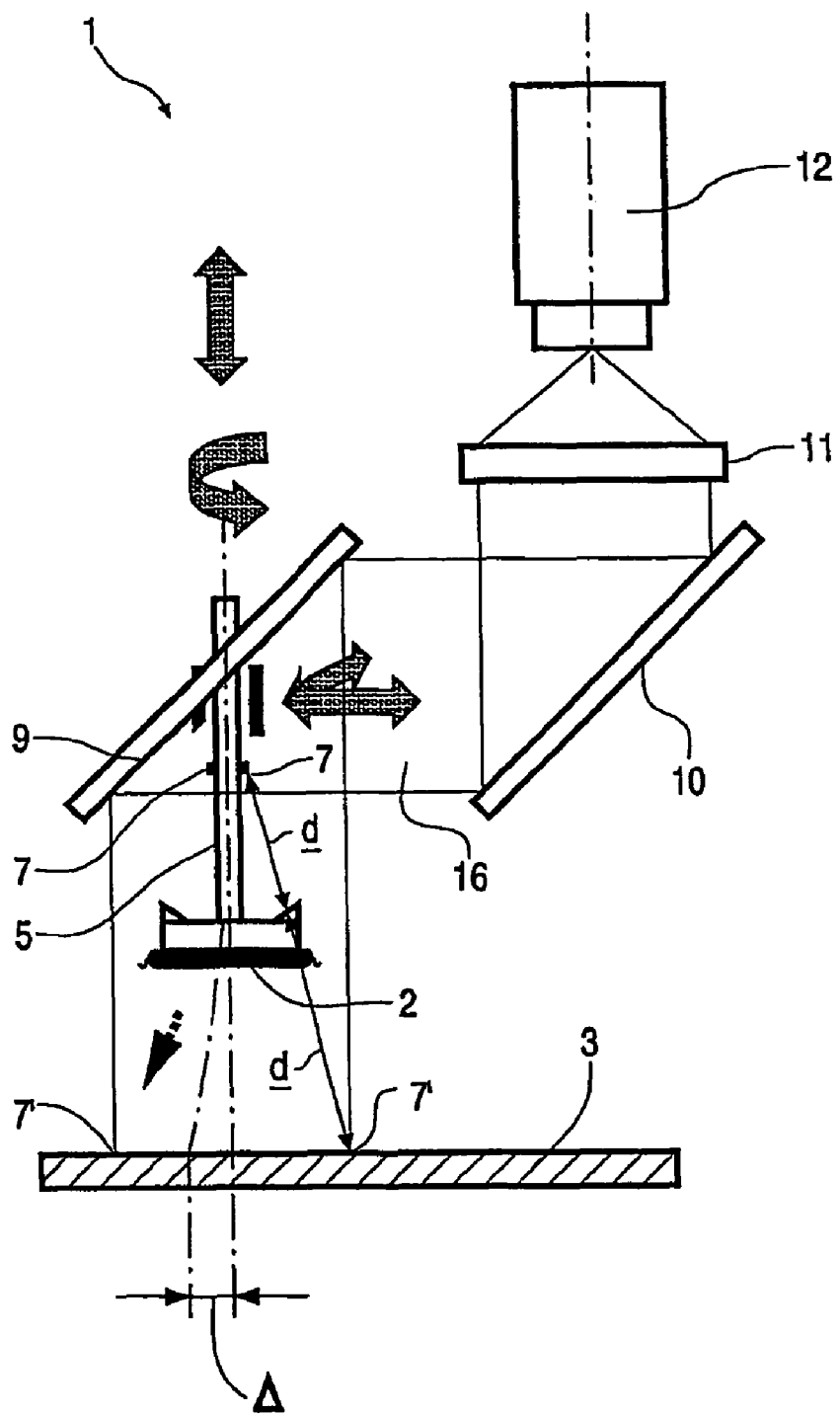
Figure 1C:
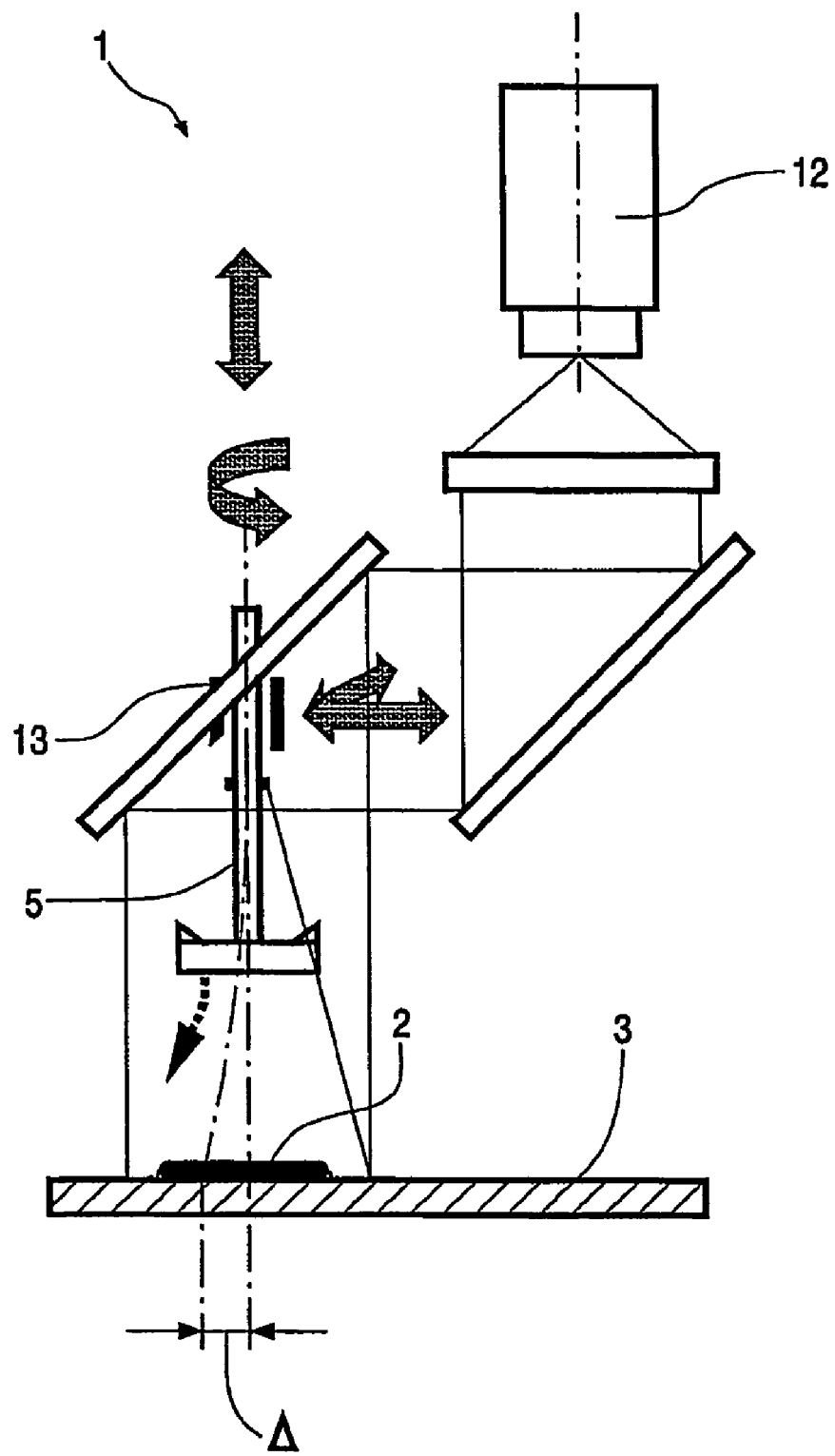

FIGS. 1A to 1C show a device 1 according to the invention during different stages of placing a component 2 on a substrate 3.

The placement device 1 has a tube 5 extending along a centerline 4, which tube has a nozzle 6 at its lower side. Sub-atmospheric pressure can be provided in the tube 5 and the nozzle 6 for taking up a component. The tube 5 has a plurality of marks 7 regularly distributed on the circumference. The side of the nozzle 6 facing the marks 7 is provided with mirrors 8. The tube 5 extends on a side remote from the nozzle 6 through a mirror 9 arranged at an angle of 45° with respect to the centerline 4. A second mirror 10 extending parallel to the mirror 9 is spaced apart from the mirror 9. A lens system 11 is spaced apart from the mirror 10. A camera 12 is arranged on a side of the lens system 11 remote from the mirror 10.

Together with the mirrors 9,10, the lens system 11, and the camera 12, the placement device 1 can be displaced in and opposite to the directions denoted by the arrows $X_1, Y_1$ and $Z_1$. The displacement is effected by means of a known displacement device (not shown). Together with the nozzle 6, the tube 5 is displaceable by means of actuators 13, arranged proximate to the mirror 9, through relatively small distances with respect to the camera 12 in and opposite to the directions denoted by arrows $X_2, Y_2$ and $Z_2$. In addition, the nozzle 6 is rotatable around the centerline 4 in and opposite to the directions denoted by arrow $\phi$.

As is further visible in FIG. 1A, a second camera 14 and an optical system 15 situated between the nozzle 6 and the camera 14 are arranged on a side of the nozzle 6 remote from the camera 12.

The operation of the device according to the invention will now be explained with reference to FIGS. 1A to 1C.

Together with the camera 12, the placement device 1 is displaced to a component supply device (not shown) where a component 2 is taken up with vacuum by means of the nozzle 6. Subsequently, the component 2 is displaced in the directions denoted by $X_1, Y_1$ and $Z_1$ by means of the placement device 1 until the component 2 is situated above the camera 14. Subsequently, the position of component 2 with respect to the nozzle 6 and thus the placement device 1 is determined (FIG. 1A) by means of the camera 14 and a processor (not shown) connected thereto.

After the position of the component 2 with respect to the placement device 1 has been determined, the placement device 1 is displaced together with the camera 12 in the $X_1, Y_1$ and $Z_1$ directions until the component 2 is situated in an intermediate position, shown in FIG. 1B, above the substrate 3 proximate to the desired position on the substrate 3. An image of a part of the substrate 3 on which the component 2 is to be positioned is now made by means of the camera 12. The tube 5 situated in the optical path 16, the marks 7 on this tube and the nozzle 6 will also be visible on the image. At the instant when an image is made by means of the camera 12, the distance d between the marks 7 and the mirrors 8 is preferably equal to the distance between the mirrors 8 and the substrate 3 so that, optically, the mirror images 7' of the marks 7 are situated, as it were, on the substrate 3. With a relatively small depth of focus of the camera 12, an accurate image can thus still be made. Subsequently, the orientation of the substrate 3 (and notably the part on which the component is to be positioned) is determined with respect to the mirror images 7' of the marks 7 (and hence the placement device 1) by means of a processor and with reference to the image 12 obtained from the camera 12. Thereafter, the relative position of the component 2 with respect to the substrate 3 is computed by means of the processor with reference to the previously determined orientation of the component 2 with respect to the placement device 1 and the now computed orientation of the mirror images 7' of the marks 7 (and hence the placement device 1) with respect to the substrate 3.

In the situation shown in FIG. 1B, the component 2 is situated (in the intermediate position at a distance) in the X direction of the desired position on the substrate 3.

After the relative position of the component 2 has been computed with respect to the substrate 3, the tube 5 is displaced: (a) in the downward direction $Z_2$ with respect to the camera 12; (b) in the $X_2$ direction; and, if desired, (c), a desired correction in the $Y_2$ direction may be performed by means of the actuators 13. The tube 5 is displaced in the $Z_2$ direction until the component 2 is positioned on the substrate 3.

During displacement of the tube 5 in the downward direction, it is possible to continuously make images by means of the camera 12 so that it is also possible during this downward displacement of the tube 5 to compute a supplementary correction in the $X_2$ or $Y_2$ direction and perform this correction by means of the actuators 13.

Figure 2:
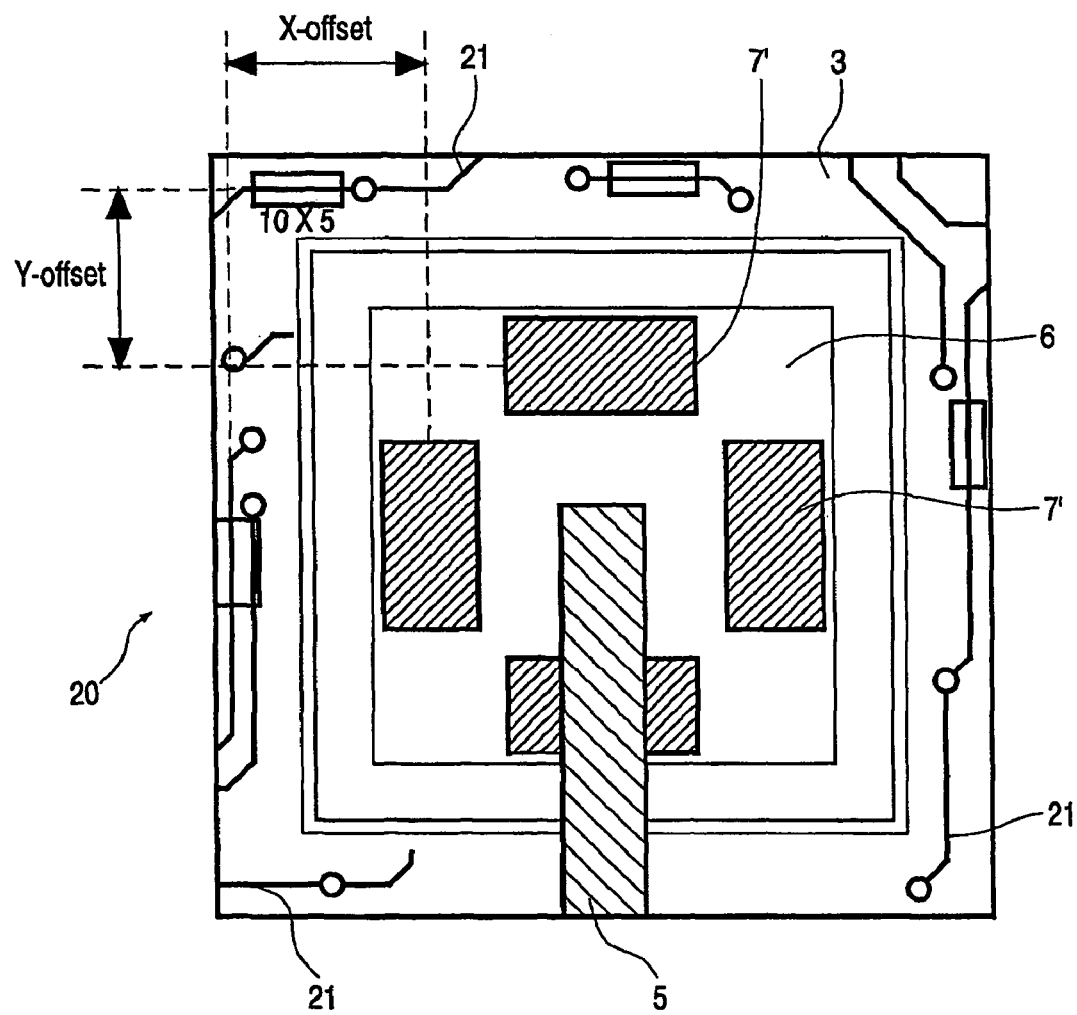
FIG. 2 shows an image made by means of the device shown in FIG. 1.

FIG. 2 shows an image 20 made by means of a camera 12, in which image a part of the substrate 3 as well as the tube 5, the nozzle 6 and the mirror images 7' of the marks 7 are visible. The substrate 3 is provided with a plurality of electric wires 21 with respect to which the component 2 to be placed must be aligned. The intermediate position of the component 2 in the situation shown in FIG. 1B with respect to the desired position on the substrate can be determined with reference to the image 20.

Figure 3:
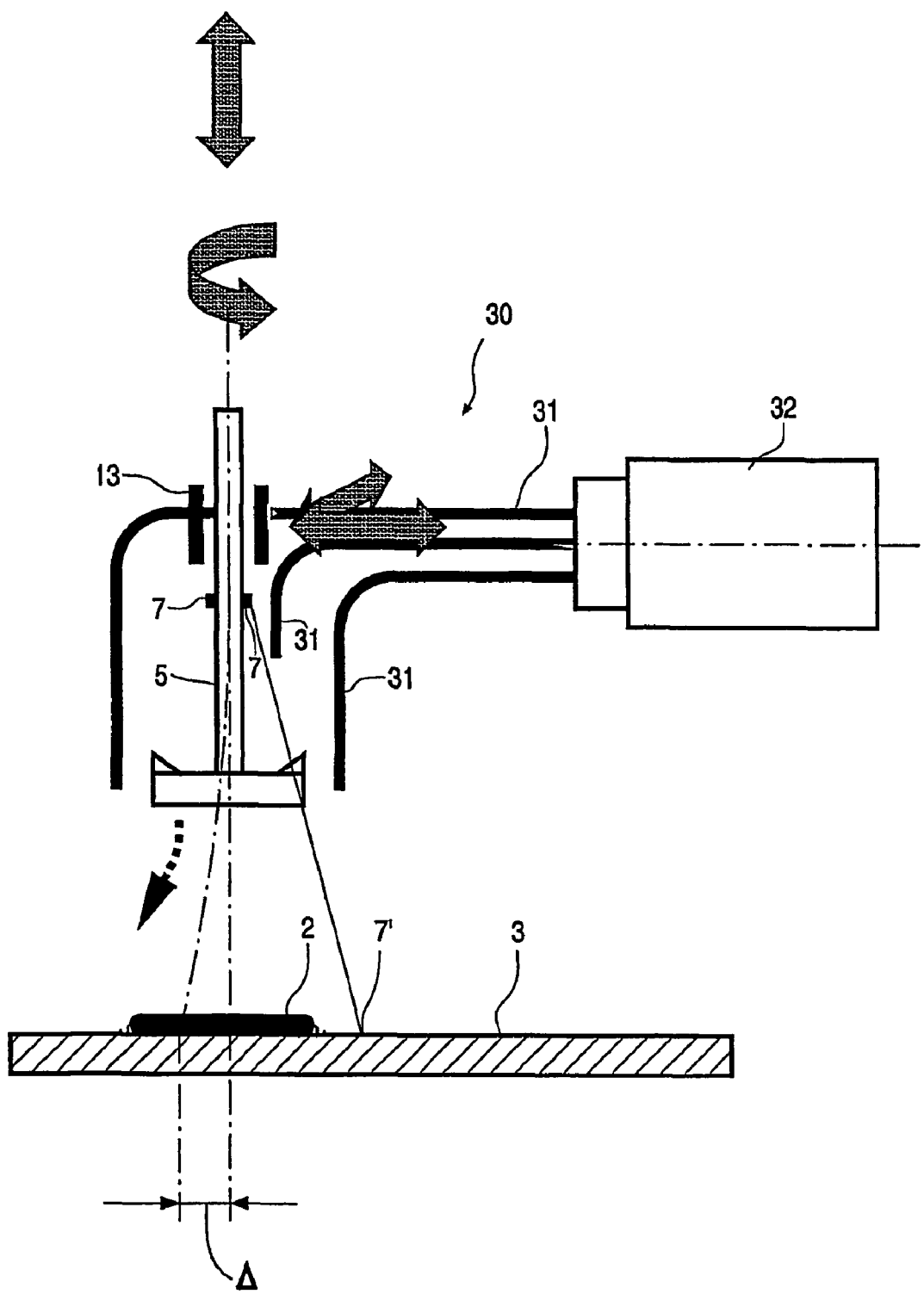
FIG. 3 shows a second embodiment of a device according to the invention.

FIG. 3 shows a second embodiment of a device 30 according to the invention which, instead of mirrors 9, 10 and an optical system 11, is provided with a plurality of glass fibers 31, whose first ends are connected to a camera 32 and the ends remote from the camera 32 face the substrate 3. Such a camera 32 also provides the possibility of determining the relative position of the tube 5 of the placement device 30 with respect to the substrate 3.

Figure 4:
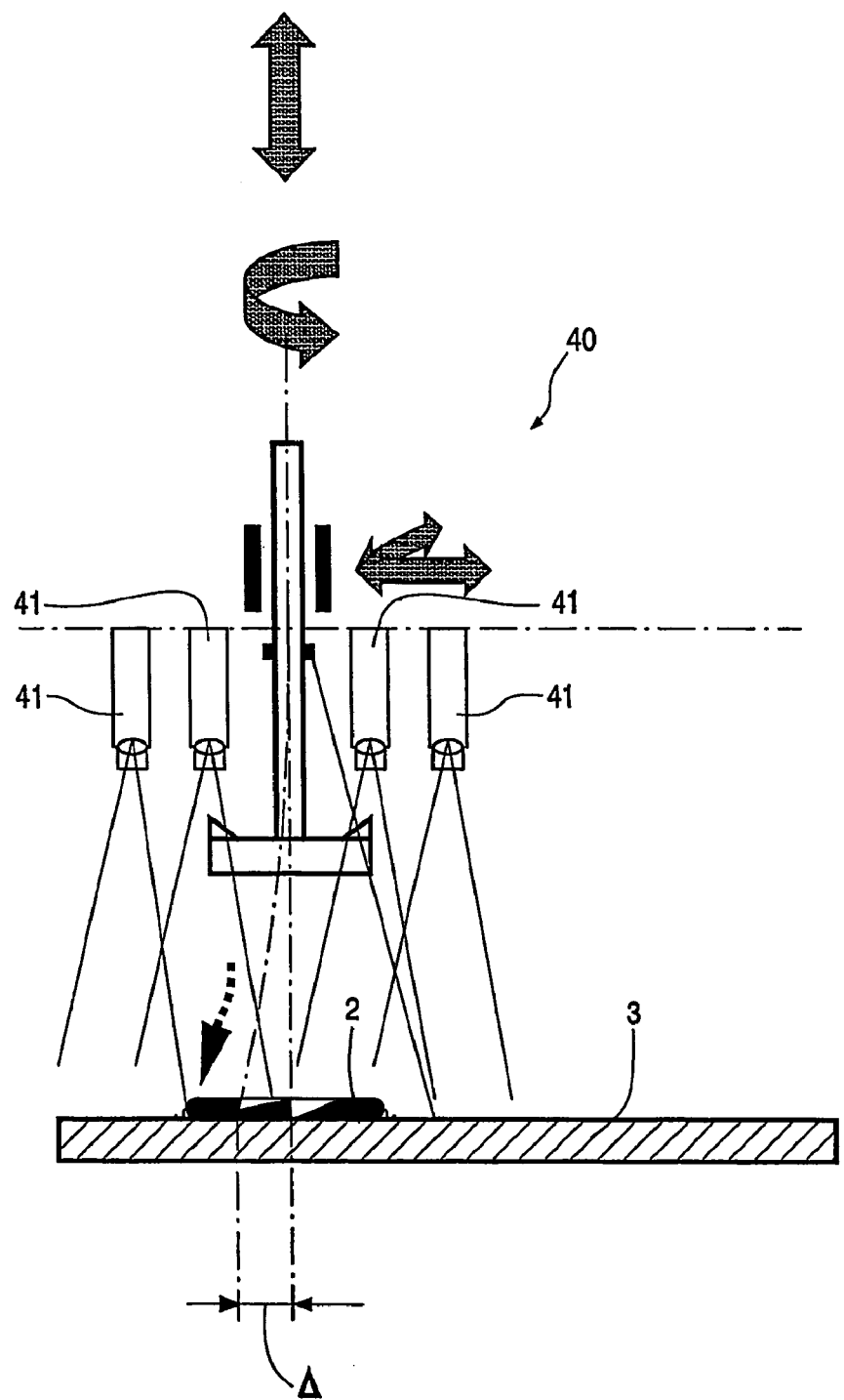
FIG. 4 shows a third embodiment of a device according to the invention.

FIG. 4 shows a third embodiment of a device 40 according to the invention, in which the relative position of the tube 5 of the placement device 40 with respect to the substrate 3 is determined by means of a plurality of cameras 41 before component 2 is positioned on the substrate 3.

If the component 2 is relatively large, i.e. if it is larger than the nozzle 6, it is alternatively possible to directly obtain an image by means of the camera 12, 32, 41, on which image a part of the placement device, the component and a part of the substrate 3 are visible. The relative position of the component 2 with respect to the substrate 3 can then be directly determined with reference to this image.

When determining the position of the component with respect to the nozzle 6, use can be made of a fixed marking plate. An image of the marking plate and a component positioned above this plate is simultaneously made by means of the camera 14, while an image of the marking plate and the marks 7 is made by means of camera 12. The position of the component with respect to the marks is subsequently determined from both images.

It is alternatively possible to use light-emitting diodes (LED) or light-conducting fibers as marks 7.

Components may be placed relatively rapidly by means of the device and method according to the invention. Moreover, although the entire device may be relatively inaccurate, a desired accuracy can be realized during actual placement.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

The invention claimed is:

1. A method of placing a component at a desired position on a substrate by a placement device, the method comprising the steps of:
    supporting the component using the placement device, the placement device including at least one mark and at least one mirror arranged between the mark and a substrate carrier, a mirror image of the mark in the mirror being located closer to the substrate than the mark itself;
    displacing the component by the placement device to an intermediate position above the desired position on the substrate;
    determining a difference between the intermediate position and the desired position of the component on the substrate by at least a camera and a processor, the step of determining the difference comprising the step of:
        creating, from a side of the component remote from the substrate, an image of at least a part of the substrate comprising the desired position and of at least the mirror image of the mark of the placement device supporting the component;
    displacing the component by the placement device on the basis of the difference between the intermediate position and the desired position with respect to the substrate; and
    positioning the component at the desired position on the substrate.

2. The method according to claim 1, wherein a relative position of the placement device with respect to the desired position of the component on the substrate is determined from the image.

3. The method according to claim 1, wherein, prior to displacing the placement device to the intermediate position situated above the desired position, the method further comprises the steps of:
    determining a relative position of the component with respect to the placement device;
    determining, with reference to the image, a relative position of the placement device with respect to the desired position on the substrate; and
    determining, with reference to the relative positions of the component with respect to the placement device and the placement device with respect to the desired position on the substrate, a relative position of the component with respect to the substrate.

4. The method according to claim 1, wherein the step of creating, from a side of the component remote from the substrate, an image of at least a part of the substrate comprising the desired position and of at least the mirror image of the mark of the placement device supporting the component comprises the steps of:
    imaging, from a side of the component remote from the placement device, the component and the placement device using a second camera; and
    determining, with reference to the image, a relative position of the component with respect to the placement device.

5. The method according to claim 1, wherein the component is also visible on the image of at least the part of the substrate, and wherein the method further comprises the step of:
    determining a relative position of the component with respect to the substrate with reference to the image.

6. The method according to claim 1, wherein the mirror image of the mark is located on the substrate.

7. The method according to claim 1, wherein the step of positioning the component at a desired position on the substrate comprises the step of lowering the component onto the substrate.

8. A device comprising:
    a substrate carrier;
    a placement device that is displaceable with respect to the substrate carrier, the placement device including at least one mark and at least one mirror arranged between the mark and the substrate carrier;

at least one camera;

a processor; and an optical system arranged between the camera and the placement device, wherein the camera, with the optical system, is configured to image at least a mirror image of the mark of the placement device and at least a part of a substrate supported, in operation, by the substrate carrier, the mirror image of the mark in the mirror is located closer to the substrate than the mark itself.

9. The device according to claim 8, wherein the device is configured to perform a method of placing a component at a desired position on the substrate by the placement device, the method comprising the steps of:

supporting the component using the placement device;

displacing the component by the placement device to an intermediate position above the desired position on the substrate;

determining a difference between the intermediate position and the desired position of the component on the substrate by at least the at least one camera and the processor, the step of determining the difference comprising the step of:

creating, from a side of the component remote from the substrate, the image of at least the part of the substrate comprising the desired position and of at least the mirror image of the mark of the placement device supporting the component;

displacing the component by the placement device on the basis of the difference between the intermediate position and the desired position with respect to the substrate; and positioning the component at the desired position on the substrate.

10. The device according to claim 8, wherein a distance between the mirror and the substrate supported, in operation, by the substrate carrier is substantially equal to a distance between the mirror and the mark during imaging of the substrate in the camera.

11. The device according to claim 8, wherein the placement device comprises a vacuum tube that is displaceable with respect to the placement device.

12. The device according to claim 8, wherein the mirror image of the mark is located on the substrate.

13. The device according to claim 9, wherein the step of positioning the component at a desired position on the substrate comprises the step of lowering the component onto the substrate.

* * * * *